United States Patent [19]
Muka

[11] Patent Number: 5,752,796
[45] Date of Patent: May 19, 1998

[54] VACUUM INTEGRATED SMIF SYSTEM

[76] Inventor: Richard S. Muka, 32 Candlewood Dr., Topsfield, Mass. 01983

[21] Appl. No.: 590,757

[22] Filed: Jan. 24, 1996

[51] Int. Cl.$^6$ .................................................. B65G 49/07
[52] U.S. Cl. ................... 414/217; 414/416; 414/935; 414/937; 414/939
[58] Field of Search ................... 414/217, 225, 414/331, 416, 935, 937, 939–941

[56] References Cited

U.S. PATENT DOCUMENTS

| | | | |
|---|---|---|---|
| 4,532,970 | 8/1985 | Tullis et al. | 141/98 |
| 4,534,389 | 8/1985 | Tullis | 141/98 |
| 4,674,936 | 6/1987 | Bonora | 414/217 |
| 4,674,939 | 6/1987 | Maney et al. | 414/292 |
| 4,676,709 | 6/1987 | Bonora et al. | 414/217 |
| 4,724,874 | 2/1988 | Parikh et al. | 141/98 |
| 4,739,882 | 4/1988 | Parikh et al. | 206/454 |
| 4,802,809 | 2/1989 | Bonora et al. | 414/217 |
| 4,815,912 | 3/1989 | Maney et al. | 414/217 |
| 4,859,137 | 8/1989 | Maney et al. | 414/648 |
| 4,974,166 | 11/1990 | Maney et al. | 364/478 |
| 4,995,430 | 2/1991 | Bonora et al. | 141/98 |
| 5,097,421 | 3/1992 | Maney et al. | 364/478 |
| 5,112,277 | 5/1992 | Cruz et al. | 414/935 |
| 5,166,884 | 11/1992 | Maney et al. | 364/468 |
| 5,169,272 | 12/1992 | Bonora et al. | 414/217 |
| 5,431,600 | 7/1995 | Murata et al. | 414/225 X |
| 5,527,390 | 6/1996 | Ono et al. | 414/940 X |
| 5,586,585 | 12/1996 | Bonora et al. | 414/217 X |
| 5,607,276 | 3/1997 | Muka et al. | 414/941 X |

FOREIGN PATENT DOCUMENTS

| | | |
|---|---|---|
| 0 340 345 | 1/1993 | European Pat. Off. . |
| 0117004 | 9/1993 | Germany . |
| 8600870 | 2/1986 | WIPO . |
| 9014273 | 11/1990 | WIPO . |
| 9318543 | 9/1993 | WIPO . |

OTHER PUBLICATIONS

"Wafer Confinement for Control of Contamination in Microelectronics", Solid State Technology, Aug. 1990, pp. S1–S5.
ACR ERGOSMIF MAN Brochure, 15 pages, undated.

*Primary Examiner*—James W. Keenan
*Attorney, Agent, or Firm*—Perman & Green

[57] ABSTRACT

A system uses a portable carrier for transporting multiple semiconductor wafers in a substantially particle free environment. A cassette freely received within the carrier for supporting the wafers in spaced generally stacked relationship is delivered to an environmentally clean load lock. A mini-environment defines an interior region adjacent the load lock for the engageable reception of the carrier and sealingly isolates the load lock chamber and the interior of the carrier from the surrounding atmosphere. Transfer mechanisms serve to retrieve the cassette from the carrier and move the carrier into the load lock chamber while maintaining it in a particle free environment. A first transport mechanism within the mini-environment retrieves the cassette from the carrier and moves it into its interior region and a second transport mechanism within the load lock retrieves the cassette from the interior region and moves it into the load lock chamber. To aid in moving the cassette into the interior region, a hood of the mini-environment is movable between lowered and raised positions while maintaining a capillary seal with its upstanding walls. Sensors inform whether a cassette is present in the SMIF box, whether wafers are properly positioned in the cassette, and whether the cassette is properly gripped as it is being moved into the interior region. Laminar flow air is continually directed through the interior region of the mini-environment and filtered to remove foreign particles from the wafers being supported in the cassette.

64 Claims, 9 Drawing Sheets

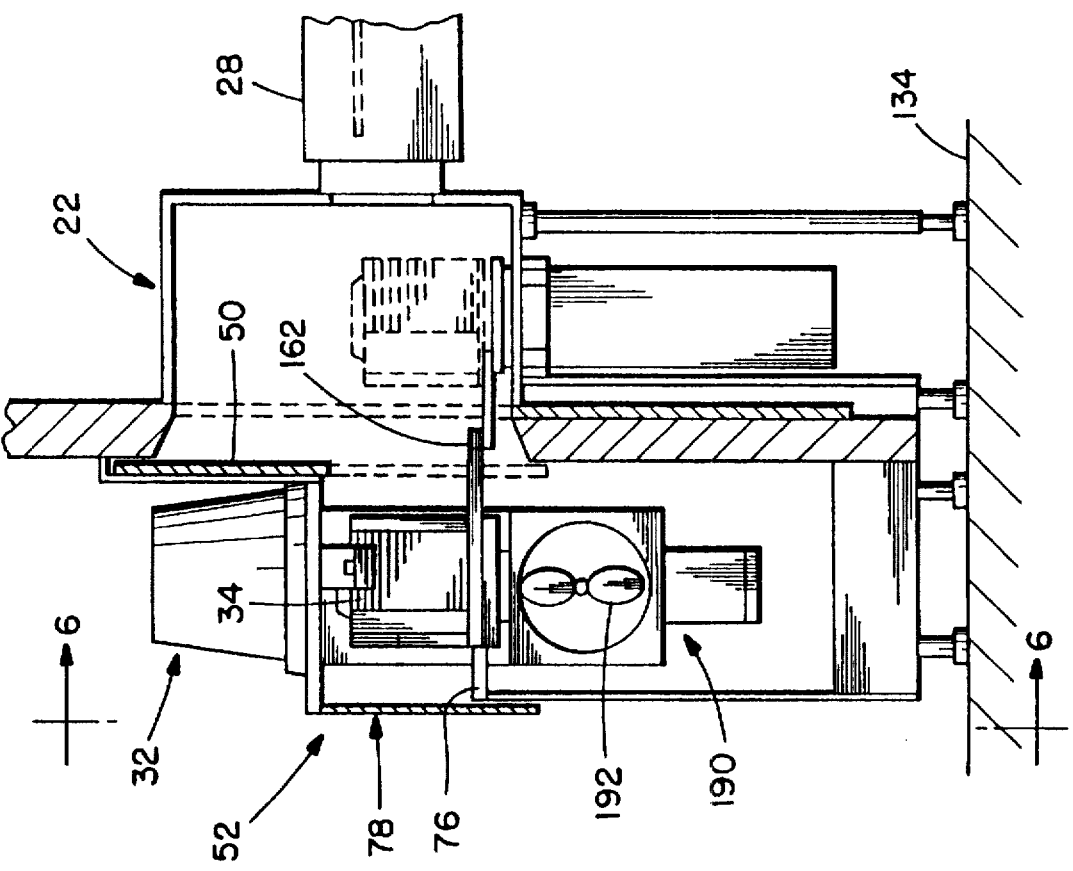
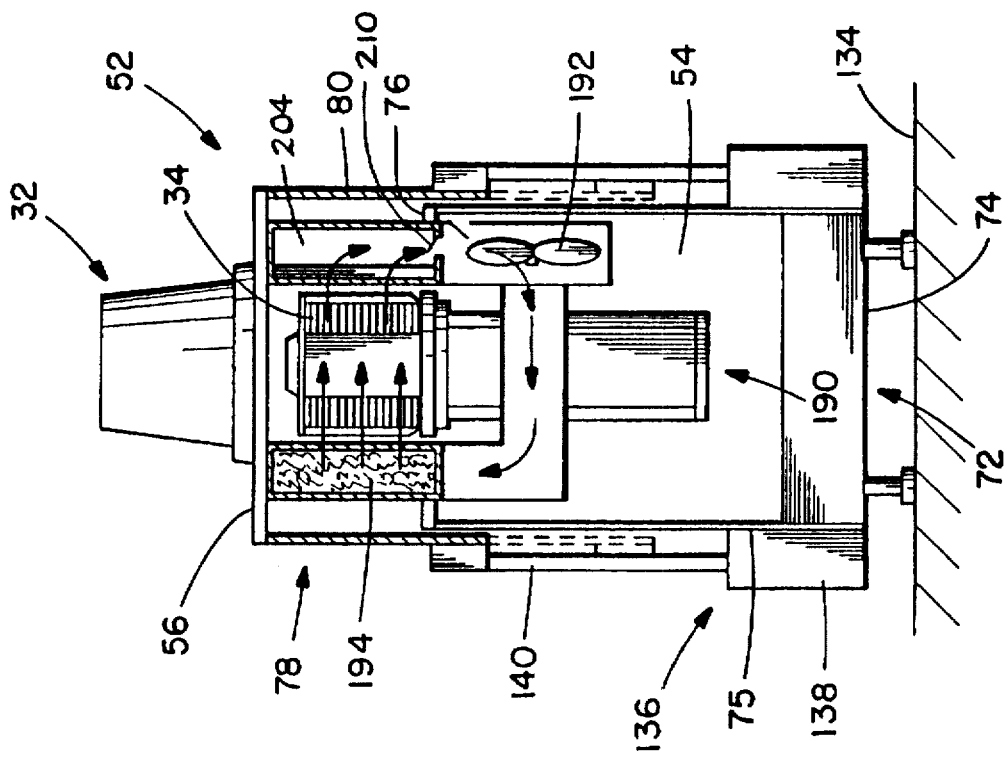

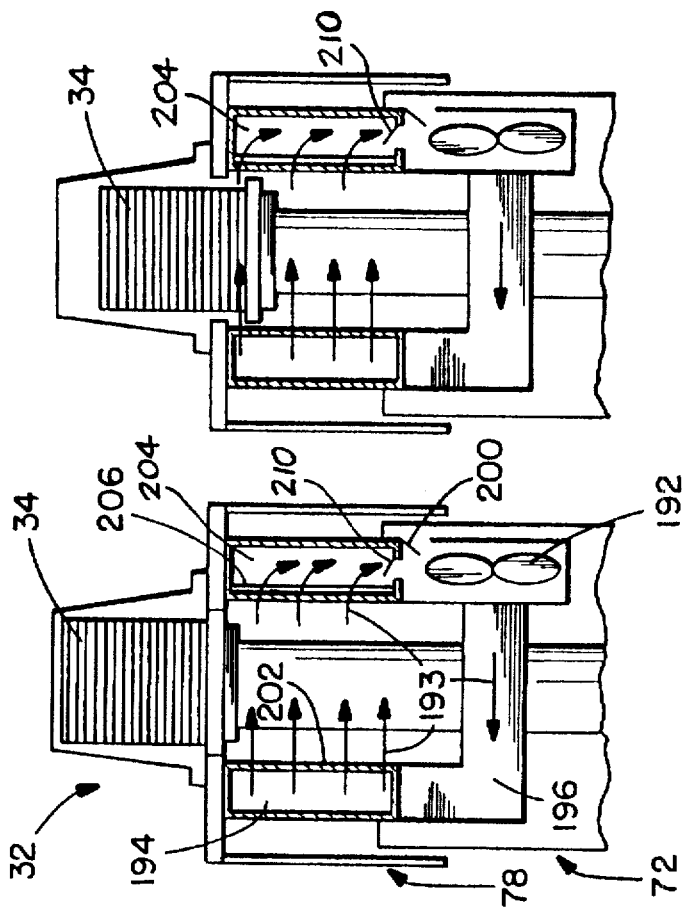

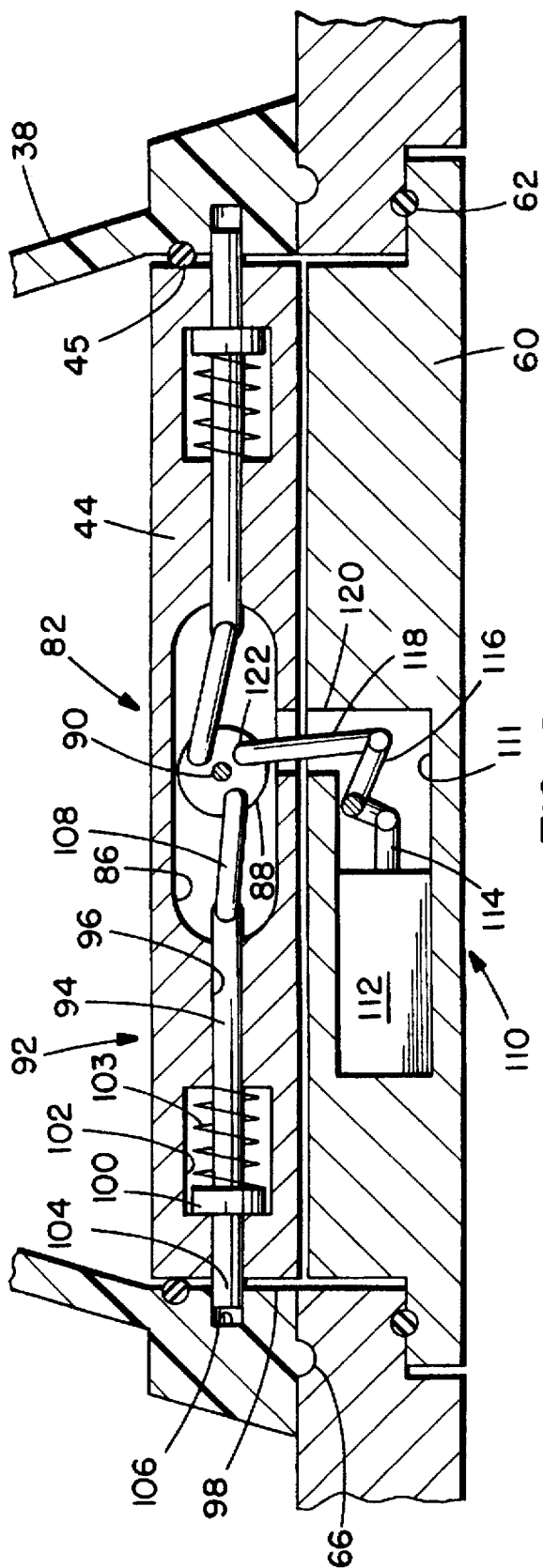
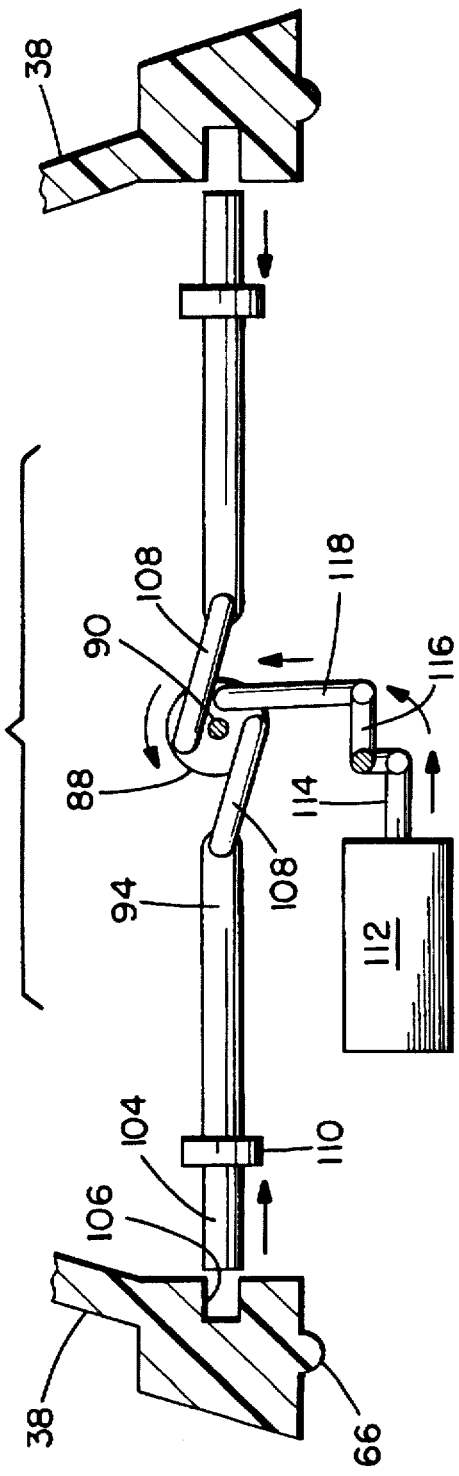

5,752,796

1

VACUUM INTEGRATED SMIF SYSTEM

BACKGROUND OF THE INVENTION

1. Field of the Invention

The present invention relates to standardized mechanical interface systems for reducing particle contamination and more particularly to apparatus employing sealed containers suitable for use in semiconductor processing equipment to prevent particle contamination. Still more particularly, the invention relates to such systems enabling efficient transfer of semiconductor wafers between a transportable container or carrier and a load lock chamber with a controllable environment as they await further transfer to a processing station. Throughput of the manufacturing process is thereby significantly increased.

Throughout this disclosure, the term "wafer" will be used for purposes of consistency to refer to planar substrates such as silicon wafers and glass flat panels, but it will be understood that it is intended to be used in the broad context so as to be applicable to all substrates. Typically, such substrates are circular and have a diameter of 200 mm and a thickness of approximately 0.760 mm although, more recently, the diameter of choice has evolved to 300 mm with the same thickness.

2. Description of the Prior Art

Control of particulate contamination is imperative for cost effective, high-yielding and profitable manufacturing of VLSI circuits. Because design rules increasingly call for smaller and smaller lines and spaces, it is necessary to exert greater and greater control on the number of particles and to remove particles with smaller and smaller diameters.

Some contamination particles cause incomplete etching in spaces between lines, thus leading to an unwanted electrical bridge. In addition to such physical defects, other contamination particles may cause electrical failure due to induced ionization or trapping centers in gate dielectrics or junctions.

The main sources of particulate contamination are personnel, equipment, and chemicals. Particles given off by personnel are transmitted through the environment and through physical contact or migration onto the wafer surface. People, by shedding of skin flakes, for example, are a significant source of particles that are easily ionized and cause defects.

Modern processing equipment must be concerned with particle sizes which range from below 0.01 micrometers to above 200 micrometers. Particles with these sizes can be very damaging in semiconductor processing. Typical semiconductor processes today employ geometries which are 1 micrometer and under. Unwanted contamination particles which have geometries measuring greater than 0.1 micrometer substantially interfere with 1 micrometer geometry semiconductor devices. The trend, of course, is to have smaller and smaller semiconductor processing geometries.

In the recent past, "clean rooms" were established in which through filtering and other techniques, attempts were made to remove particles having geometries of 0.03 micrometer and above. There is a need, however, to improve the processing environment. The conventional "clean room" cannot be maintained as particle free as desired. It is virtually impossible to maintain conventional clean rooms free of particles of a 0.01 micrometer size and below. Although clean room garments reduce particle emissions, they do not fully contain the emissions. It has been found that as many as 6000 particles per minute are emitted into an adjacent one cubic foot of space by a fully suited operator.

2

To control contamination particles, the trend in the industry is to build more elaborate (and expensive) clean rooms with HEPA and ULPA recirculating air systems. Filter efficiencies of 99.999% and up to ten complete air exchanges per minute are required to obtain an acceptable level of cleanliness.

Particles within the equipment and chemicals are termed "process defects." To minimize process defects, processing equipment manufacturers must prevent machine generated particles from reaching the wafers, and suppliers of gases and liquid chemicals must deliver cleaner products. Most important, a system must be designed that will effectively isolate wafers from particles during storage, transport and transfer into processing equipment. The Standard Mechanical Interface (SMIF) system has been devised, and used, to reduce particle contamination by significantly reducing particle fluxes onto wafers. This end is accomplished by mechanically ensuring that during transport, storage and processing of the wafers, the gaseous media (such as air or nitrogen) surrounding the wafers is essentially stationary relative to the wafers and by ensuring that particles from the ambient outside environment do not enter the immediate internal wafer environment.

The SMIF concept is based on the realization that a small volume of still, particle-free air, with no internal source of particles, is the cleanest possible environment for wafers.

A typical SMIF system utilizes (1) minimum volume, dustproof boxes or carriers for storing and transporting (2) open rack wafer cassettes, and (3) doors on the boxes or carriers designed to mate with doors on the interface ports on the processing equipment and the two doors being opened simultaneously so that particles which may have been on the external door surfaces are trapped ("sandwiched") between the doors.

In a typical SMIF system, a box or carrier is placed at the interface port and latches release the box door and the port door simultaneously. A mechanical elevator lowers the two doors, with the cassette riding on top. A manipulator picks up the cassette and places it onto the cassette port/elevator of the equipment. After processing, the reverse operation takes place.

SMIF systems have proved to be effective and this fact has been shown by experiments using SMIF components both inside and outside a clean room. The SMIF configuration achieved a ten-fold improvement over the conventional handling of open cassettes inside the clean room.

Using SMIF systems, it has been customary to carry a large number of the wafers within the box or carrier by supporting them in a spaced relationship by means of a cassette. Using this technique, the cassette is loaded with a supply of wafers, transported into the box or carrier, then subsequently wafers are removed from the cassette in the carrier one by one for placement into a reception chamber at the site of further processing.

Typical of known systems are the following items of prior art, all of which disclose apparatus utilizing a transportable sealable container such as a SMIF pod including a box, box door, and a suitable sealing arrangement:

U.S. Pat. No. 4,995,430 issued Feb. 26, 1991 to Bonora et al.

PCT Applic. No. US90/01995 filed Apr. 13, 1990

PCT Applic. No. US85/01446 filed Jul. 29, 1985

In each instance, the box is used to carry a plurality of wafers in an ultra-clean environment from a distant location to an enclosed canopy with such a contained environment adjacent a wafer processing station. Generally, the enclosed canopy incorporates appropriate seals, latching, and transport mechanisms for the transfer of the wafers between the SMIF pod and the canopy.

In EPO patent No. 340,345 B1 to Michael Waide et al., issued Jan. 27, 1993, provision is made for the flow of clean air through the enclosed canopy.

The paper entitled: "Wafer Confinement for Control of Contamination in Microelectronics" published in the August 1990 edition of SOLID STATE TECHNOLOGY at pages S1 to S5 relates the desirability of close wafer confinement and presents three known approaches for achieving the desired goal.

It was in light of the foregoing state of the art that the present invention has been conceived and is now reduced to practice. Specifically, the invention results from efforts to maintain clean room conditions for large numbers of wafers being transported at a time while significantly reducing the volume of the clean environment required and providing a protected mini-environment into which a cassette may temporarily reside when removed from a SMIF box or carrier while wafers are being transported to and from processing stations.

SUMMARY OF THE INVENTION

According to the invention, a system uses a portable carrier for transporting multiple semiconductor wafers in a substantially particle free environment. A cassette freely received within the carrier for supporting the wafers in spaced generally stacked relationship is delivered to an environmentally clean load lock. A mini-environment defines an interior region adjacent the load lock for the engageable reception of the carrier and sealingly isolates the load lock chamber and the interior of the carrier from the surrounding atmosphere. Transfer mechanisms serve to retrieve the cassette from the carrier and move the carrier into the load lock chamber while maintaining it in a particle free environment. A first transport mechanism within the mini-environment retrieves the cassette from the carrier and moves it into its interior region and a second transport mechanism within the load lock retrieves the cassette from the interior region of the mini-environment and moves it into the load lock chamber. To aid in moving the cassette into the interior region, a hood of the mini-environment is movable between lowered and raised positions while maintaining a capillary seal with its upstanding walls. Sensors inform whether a cassette is present in the SMIF box, whether wafers are properly positioned in the cassette, and whether the cassette is properly gripped as it is being moved into the interior region. Laminar flow air is continually directed through the interior region of the mini-environment and filtered to remove foreign particles from the wafers being supported in the cassette.

The invention results in an efficient, rapid operating, unified and simplified design which assures maximum throughput of processed wafers while protecting them from the outside environment throughout performance of the process steps. It moves a cassette containing a plurality of wafers into the vacuum lock (while vented) while maintaining the clean conditions of the SMIF box by utilizing the load arm already available in existing load lock constructions instead of a separate arm in a SMIF unloader or within the mini-environment. Additionally, the system of the invention introduces progressive cross flows of air as the SMIF box is opened and the cassette with its multiple wafers therein is brought into the mini-environment.

Other and further features, advantages, and benefits of the invention will become apparent in the following description taken in conjunction with the following drawings. It is to be understood that the foregoing general description and the following detailed description are exemplary and explanatory but are not to be restrictive of the invention. The accompanying drawings which are incorporated in and constitute a part of this invention, illustrate one of the embodiments of the invention, and, together with the description, serve to explain the principles of the invention in general terms. Like numerals refer to like parts throughout the disclosure.

BRIEF DESCRIPTION OF THE DRAWINGS

In the drawings:

FIG. 5 is a cross section view, taken generally across lines 5—5 in FIG. 1;

FIG. 6 is a cross section view, taken generally across lines 6—6 in FIG. 5;

FIGS. 6A–6D are diagrammatic views, generally similar to FIG. 6, illustrating successive positions of the components being illustrated in the course of operation of the system of the invention;

FIG. 6E is a detail elevation view of a part of a component illustrated in FIGS. 6 and 6A–6D;

FIG. 7 is a detail cross section view of components illustrated in FIG. 3;

FIG. 8 is a further detail cross section view, similar to FIG. 7, illustrating another operating position thereof;

DETAILED DESCRIPTION OF THE PREFERRED EMBODIMENTS

Figure 1:
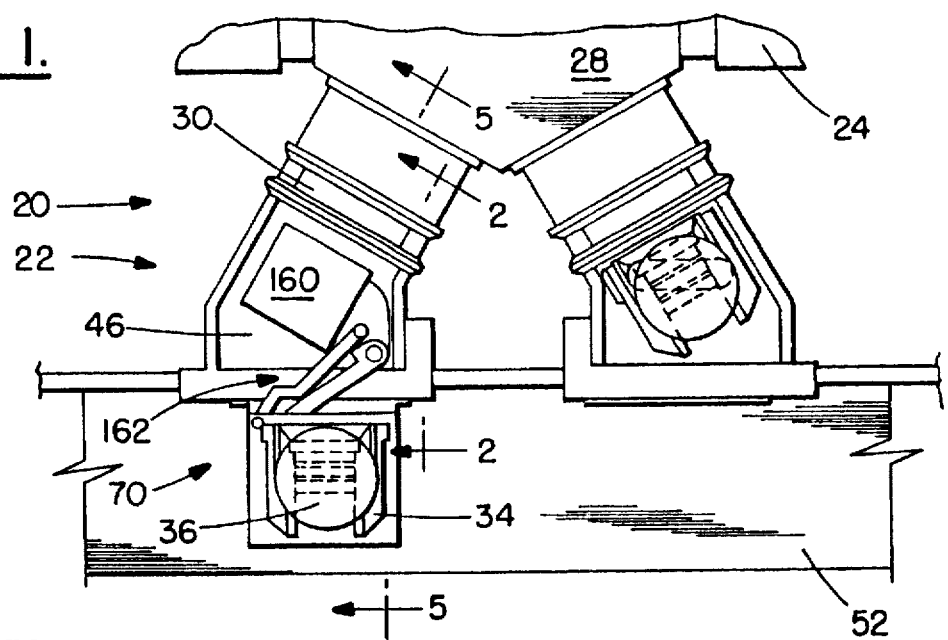
FIG. 1 is a top plan diagrammatic view of a wafer processing system embodying the present invention, with the cover removed from the load lock.
Figure 2:
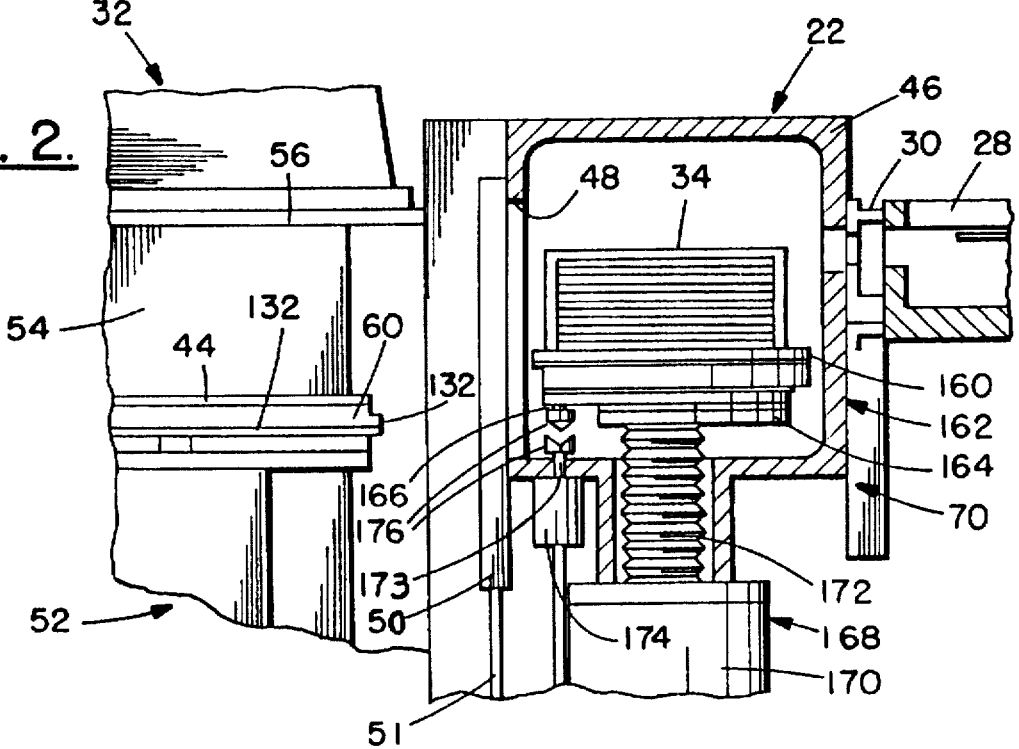
FIG. 2 is a diagrammatic cross section view, in elevation, taken generally along line 2—2 in FIG. 1 illustrating in greater detail certain components illustrated in FIG. 1.

Turn now to the drawings and, initially, to FIGS. 1 and 2 which illustrate a processing system 20 for operating on silicon planar substrates such as wafers and flat panels. As noted above, throughout the remainder of this disclosure, the term "wafer" will be used for purposes of consistency to refer to such substrates, but it will be understood that it is intended to be used in the broad context so as to be applicable to all substrates. The invention is especially beneficial for operating on the newer size of substrates.

The processing system 20 includes a load lock 22 for initially receiving wafers to be processed and a plurality of single-wafer processing stations 24 for operations on the surfaces of the wafers such as imaging, plasma etching, and the like. It is typical for the processing stations 24 to be arranged about a closed locus with a transport chamber 28 being disposed concentrically within the load lock 22 and the processing stations 24 for singly transferring wafers to be processed and after processing between the load lock and one or more of the processing stations 24. A plurality of isolation valves 30 are individually provided at the interfaces of the several processing stations 24 and the transport chamber 28 and between the load lock 22 and the transport chamber 28.

As previously noted, for some time now, it has been known to employ transportable SMIF boxes or containers, herein referred to as "carriers" 32 (see especially FIG. 3), for maintaining articles, such as semiconductor wafers 36 (FIG. 1), clean. This is achieved by maintaining within each carrier a substantially particle free environment while the wafers are being brought to, or removed from, the processing system 20. It is customary to carry a large number of the wafers within the carrier by supporting them in a spaced relationship by means of a cassette 34 (FIG. 4). Using this technique, the cassette is loaded with a supply of wafers, placed in the carrier, then subsequently wafers are removed from the cassette within the carrier one by one for placement in the load lock 22 or the cassette is transferred with the wafers within a clean mini-environment existing between the carrier, SMIF box, or the like, and the wafer processing equipment.

Figure 3:
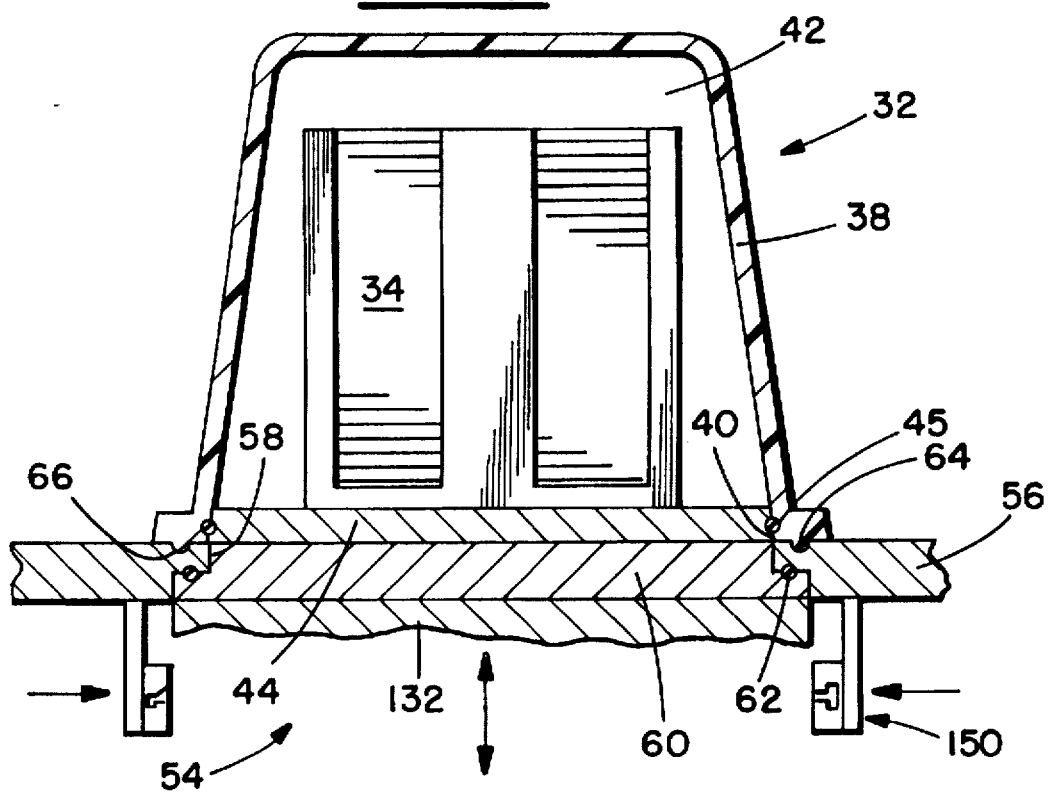
FIG. 3 is a detail diagrammatic front elevation view, in section, of one component of the invention, a carrier containing a cassette, in position on top of a mini-environment, another component of the system of the invention.
Figure 4:
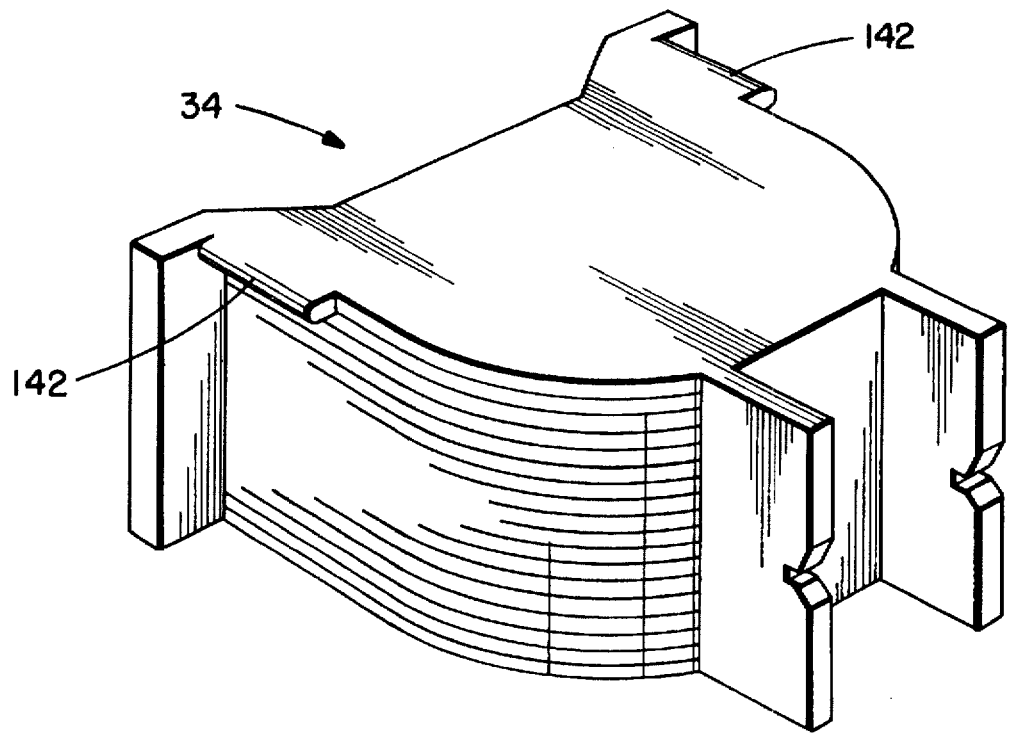
FIG. 4 is a diagrammatic perspective view of a wafer-carrying cassette of the type used with the system of the invention.

With continuing reference to FIG. 3, the portable carrier 32 for transporting the wafers in a substantially particle free environment includes a cover 38 having a carrier port 40 for providing access to its interior 42 and a carrier door 44 movable between a closed position sealingly engaged with the carrier port and an open position spaced therefrom. Airtight integrity of the carrier 32 when the carrier door 44 is in place may be assured by means of a suitable seal 45. The cassette 34 is freely received within the carrier and thus serves to support a plurality of the wafers 36 in spaced generally stacked relationship.

As noted above, the load lock 22 defines a chamber 46 with a substantially particle free environment from which individual wafers may be selectively withdrawn from the cassette 34 for placement into one or more of the processing stations 24. The load lock 22 has a load lock port 48 opening into the load lock chamber and includes a load lock door 50 movable between a closed position overlying the load lock port for sealing the load lock chamber from the surrounding atmosphere and an open position spaced from the closed position. A suitable door operating mechanism 51 (FIG. 2) is diagrammatically depicted for moving the load lock door 50 between the closed and open positions.

Adjacent the load lock 22, viewing FIGS. 1, 5 and 6, is a mini-environment 52 defining an interior region 54 for engageable reception thereon of the carrier 32. The mini-environment sealingly isolates the load lock chamber 46 and the interior 42 of the carrier from the surrounding atmosphere. The carrier 32 is brought in some suitable fashion from a remote location, then placed on a port plate 56 which is a part of the mini-environment 52. The port plate 56 has a port opening 58 therein to enable communication between the interior region 54 and the surrounding atmosphere. A port door 60 is movable between a closed position generally coplanar and is sealingly engaged with the port opening 58 and an open position disengaged and distant from the port opening. A suitable seal 62 may be employed to insure the airtight integrity of the mini-environment 52.

The port plate 56 and the carrier 32 include mutually engageable locating devices for positioning the carrier thereon such that the carrier door is proximate to and substantially coextensive with said port door. More specifically, an upper surface of the port plate 56 is formed with a plurality of depressions 64 properly spaced to receive protuberances 66 which project from the bottom of the carrier. When the protuberances 66 are fully engaged with the depressions 64, the carrier door 44 is proximate to and substantially coextensive with the port door 60.

Figure 9:
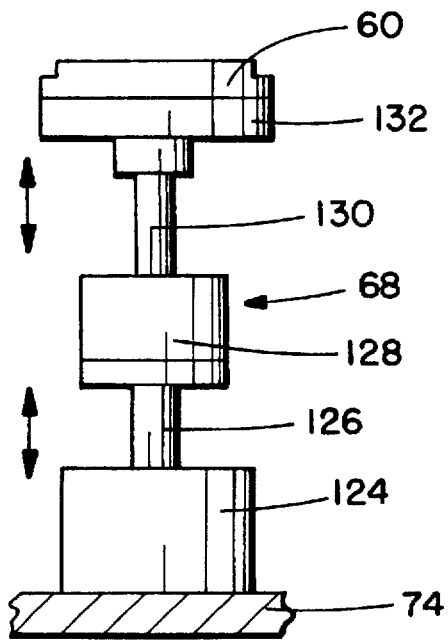
FIG. 9 is a diagrammatic side elevation view of transport apparatus located within the mini-environment of the system of the invention.

The system 20 utilizes transfer apparatus for retrieving the cassette 34 from the carrier 32 and for moving the carrier into the load lock chamber 46 while maintaining it in a particle free environment. To this end, the transfer apparatus includes a first transport mechanism 68 (FIG. 9) for retrieving the cassette from the carrier and moving it into the interior region 54 of the mini-environment 52. A second transport mechanism 70 (FIGS. 1 and 2) serves to retrieve the cassette from the interior region 54 and move it into the load lock chamber 46.

Again with particular attention to FIGS. 5 and 6, the mini-environment 52 is seen to include a main housing 72 adjacent the load lock 22 including a base 74 and upstanding walls 75 encompassing the interior region 54 and having an uppermost rim 76 defining an opening into the interior region. A hood 78 overlies the rim and the upstanding walls 75 and includes the generally level port plate 56 and integral hood walls 80 depending from the port plate. The hood walls lie in planes which are substantially parallel to the upstanding walls 75 and are in sufficient proximity to the upstanding walls to thereby form a capillary seal therebetween. The hood 78 is movable between lowered and raised positions while maintaining the capillary seal between the hood walls and the upstanding walls.

As previously noted, the port plate 56 has a port opening 58 (FIG. 3) therein to enable communication between the interior region 54 and the surrounding atmosphere. Also as previously noted, the port door 60 is movable between a closed position generally coplanar and sealingly engaged with the port opening and an open position disengaged and distant from the port opening.

Turning now to FIG. 7, the carrier door 44 is seen to be provided with a latching mechanism 82 normally biased toward a latching position sealingly, as by the seal 45, attaching the carrier door to the carrier cover 38. The latching mechanism 82 is operable for movement toward an unlatching position, as seen in FIG. 8, to selectively release the carrier door from the carrier cover.

More specifically, continuing to view FIG. 7, the carrier door 44 is formed with a central cavity 86 suitably sized and shaped to contain an eccentric disk 88 which is freely rotatable on a shaft 90. Identical latching assemblies 92 are pivotally attached to the eccentric disk 88 extending in opposite directions such that a description of one assembly will be descriptive of both. Also, there may be two or more such latching mechanisms 82 for the carrier door 44 at spaced locations. Each latching assembly includes a latch rod 94 which is longitudinally slidable in a bore 96 which extends between an edge surface 98 of the carrier door 44 and the central cavity 86. An integral bias plate 100 is located within a side cavity 102 and a compression spring 103 encircles the latch rod 94 and presses against the bias plate to urge a tip end 104 of the latch rod into engagement with an aligned hole 106 in the base of the cover 38. A connecting link 108 is suitably pivotally attached to an end of the latch rod 94 opposite the tip end 104 and to the eccentric disk 88 such that rotation of the disk in a counterclockwise direction (see FIG. 8) is effective to withdraw the tip end 104 from the hole 106 against the bias of the spring 103.

The port door 60 includes a motive mechanism 110 for selectively operating the latching mechanism 82 of the carrier door against the continuous bias imposed thereon by the springs 103 and, in this manner, to move the latching mechanism toward the unlatched position. This occurs when the port door is moved to a position contiguous with the carrier door 44 in a manner to be described. The port door 60, also, has a central cavity 111 to accommodate the motive mechanism 110. The motive mechanism 110 includes an actuator 112 which, through an actuator rod 114 pinned to one limb of a bell crank 116, operates a drive pin 118 guided by an opening is tin the port door 60. The drive pin is thus moved up and down, viewing FIGS. 7 and 8, in relation to a plane separating the carrier door from the port door. A free end of the drive pin 118 is engaged with a suitable bearing surface 122 on the eccentric disk 88 which is properly shaped and sized to receive and hold the free end of the drive pin throughout its engaged operation. That is, when the carrier door overlies the port door in the manner illustrated in FIGS. 3 and 7, the actuator may be operated to advance the drive pin 118 to engage the bearing surface 122 to rotate the eccentric disk 88 as indicated in FIG. 8 and thereby withdraw the tip ends 104 of the latch rods 94 from engagement with the holes 106 in the base of the cover 38. Oppositely, when the actuator 112 is reversed and the drive pin 118 withdrawn, so long as the tip ends 104 are aligned with their mating holes 106, the tip ends will again be caused to engage their mating holes under the bias of the springs 103.

Numerous other designs of the latching mechanism 82 and of the cooperating motive mechanism 110 may be employed to achieve the same result of selectively releasing the carrier door 44 from its associated cover 38, then reattaching the carrier door to the cover.

It was previously mentioned that the system 20 includes a first transport mechanism 68 for retrieving the cassette from the carrier and moving it into the interior region 54 of the mini-environment 52. This mechanism will now be described in greater detail with particular reference to FIG. 9. It includes a first actuator 124 mounted on the base 74 for driving a first actuator rod 126 and a second actuator 128 for driving a second actuator rod 130. The second actuator 128 is suitably fixed to the first actuator rod 126 away from the first actuator 124 and a shelf 132 for the gravitational reception thereon of the port door 60 and of the carrier door 44 with the cassette 34 supported thereon (see FIG. 3) is suitably fixed to the second actuator rod 130 away from the second actuator 128.

Figure 10A:
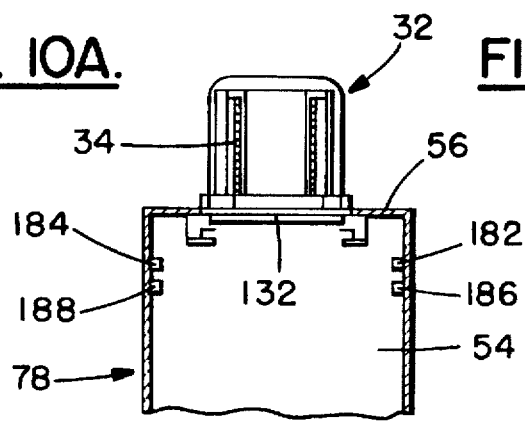
FIGS. 10A through 10H are diagrammatic side elevation views, roughly similar to a portion of FIG. 6 and illustrating successive relative positions of the components thereof.

The first actuator 124 and the second actuator 128 are operable together to move the shelf 132 from a withdrawn position distant from the port door 60 to an advanced position proximate the port door. This advanced position is diagrammatically illustrated in FIG. 10A. It is noted that, in the sequence of events for the operation of the system 20, the carrier 32 will already have been placed on the port plate 56 and properly positioned. That is, the protuberances 66 at the bottom of the carrier cover 38 are fully engaged with the depressions 64 in the port plate 56, with the result that the carrier door 44 is proximate to and substantially coextensive with the port door 60.

Figure 10B:
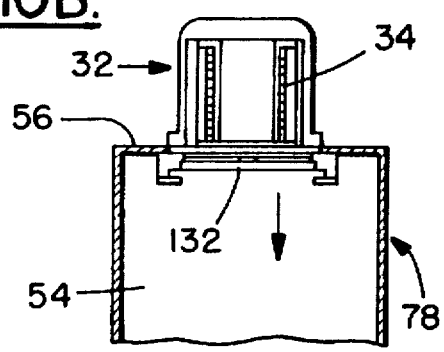

Thereupon, the motive mechanism 110 is operated to move the latching mechanism to the unlatched condition and the second actuator 128 is operated to move the shelf 132 with the port door, the carrier door and the cassette thereon to an intermediate position between the withdrawn position and the advanced position. This intermediate position is illustrated in FIG. 10B. In a typical construction, but not in any way limiting of the invention, the level of the port plate 56 above a floor 134 or other operating surface may be 900 mm and the shelf 132 will have been lowered by 19 mm to reach the position indicated in FIG. 10B.

As seen in FIG. 6, a lifting mechanism 136 is provided for moving the hood 78 between lowered and raised positions. The lifting mechanism includes a pair of cylinders 138 supported on the base 74 which operate associated linear rails 140 which are suitably attached to the hood walls 80. With operation of the lifting mechanism 136, and continuing with the sequence of operation for the system 20 of the invention, the hood 78 is typically raised 266 mm until it is positioned in the manner illustrated in FIG. 10C. This movement has the effect of lowering the cassette 34 carrying its plurality of wafers into the interior region 54 of the mini-environment 52.

Figure 13:
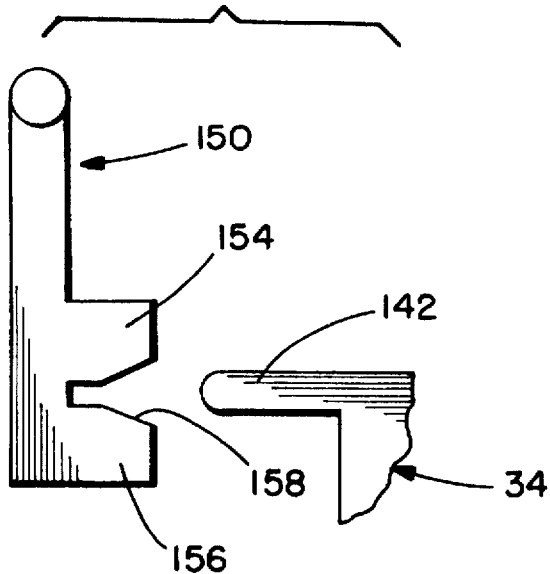
FIGS. 13 and 14 are detail side elevation view of parts of the cassette gripper mechanism in disengaged and in engaged positions, respectively.
Figure 11:
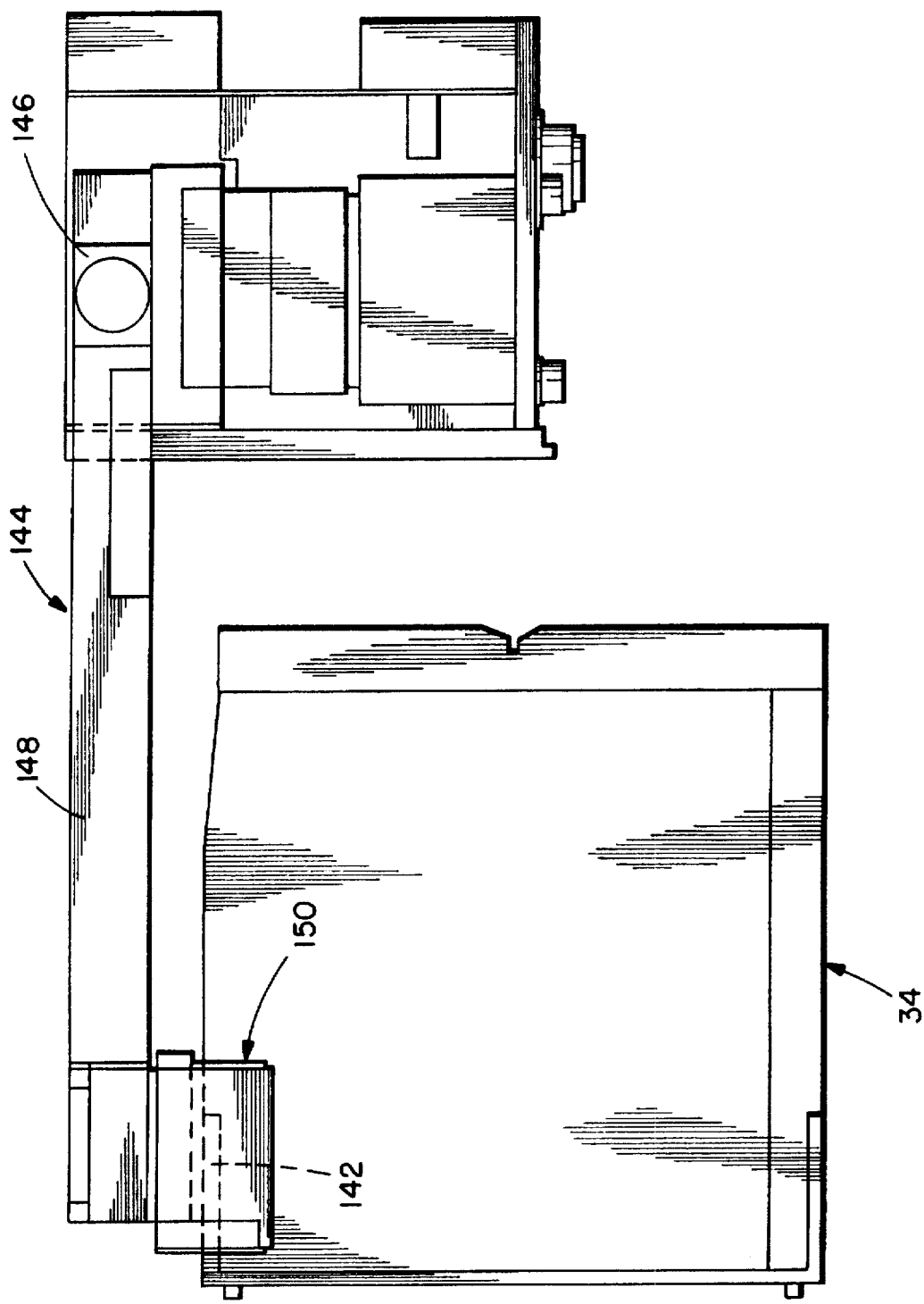
FIG. 11 is a detail side elevation view illustrating a cassette gripper mechanism used by the system of the invention.
Figure 12:
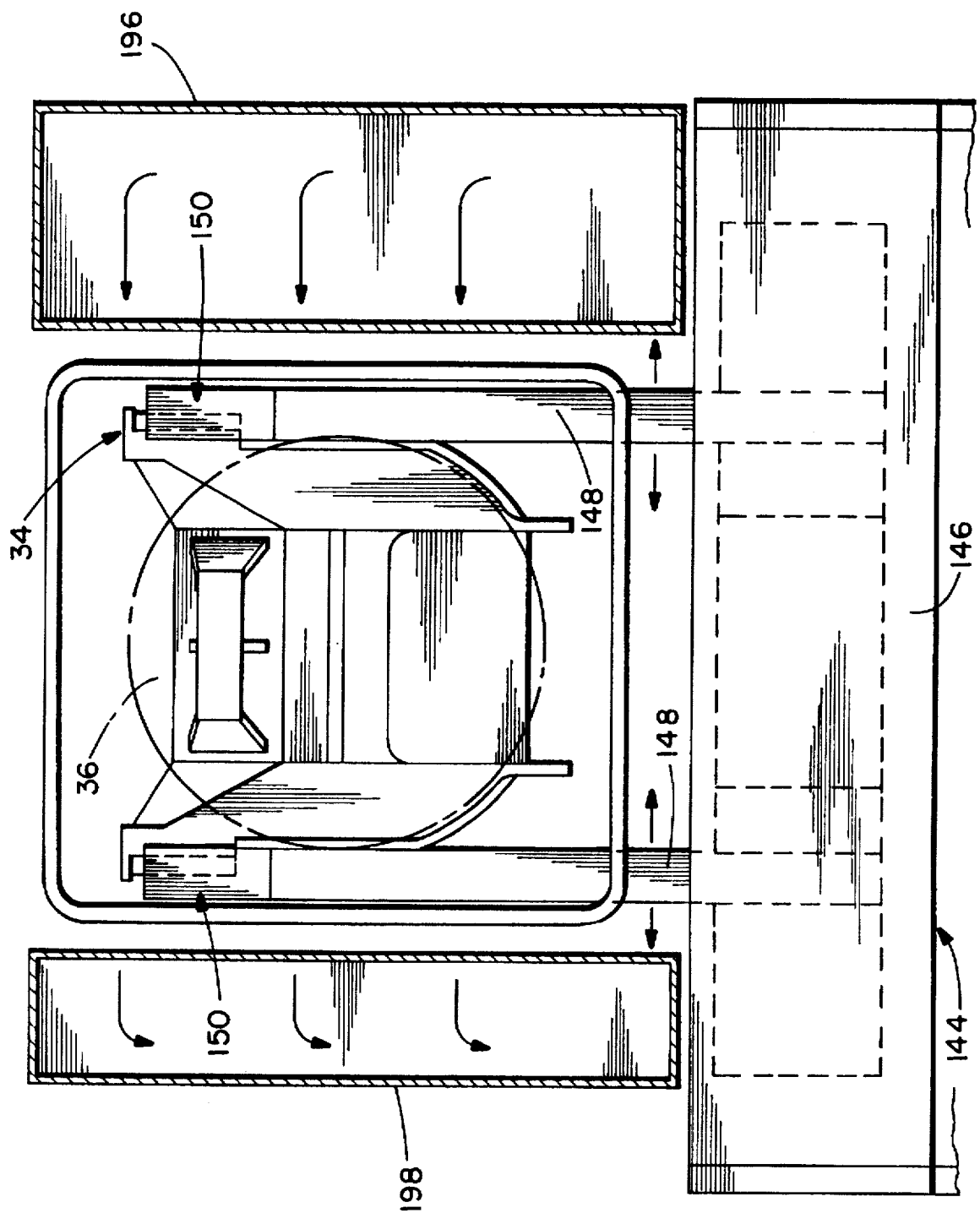
FIG. 12 is a detail top plan view, largely in cross section, illustrating the cassette gripper mechanism of FIG. 11 and other components of the invention.

As seen in FIG. 4, the cassette 34 includes integral opposed flanges 142. As seen in FIGS. 11 and 12, a gripper mechanism 144 is movable between a position disengaged from the cassette and an engaged position for holding the cassette suspended within the interior region 54. The gripper mechanism 144 is movable to the engaged position when the shelf 132 is moved to the intermediate position of FIGS. 10B and 10C. It is noteworthy that the height of the shelf 132 does not change between FIGS. 10B and 10C, that only the hood 78 moves relative to the shelf. The gripper mechanism 144 is suitably suspended from an inner surface of the port plate 56 and includes an operating appliance 146 for driving a pair of opposed cantilevered parallel support bars 148 either toward one another or away from one another. The support bars 148 extend to free ends at which are located opposed gripper finger members 150, each of which terminates at first and second opposed fingers 154, 156 which are properly spaced for releasable engagement with the opposed flanges 142 (see FIGS. 13 and 14).

Figure 10C:
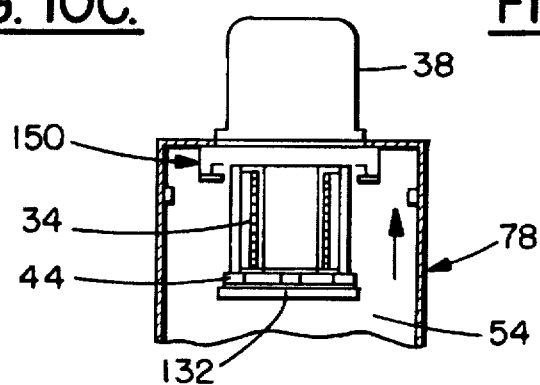

When the hood 78 is moved to the position indicated in FIG. 10C, the gripper finger members 150, or more specifically, a receiving notch 158 between the fingers 154, 156 of each of the gripper finger members is aligned in elevation with the flanges 142 of the cassette for engageably receiving the flanges.

Figure 10D:
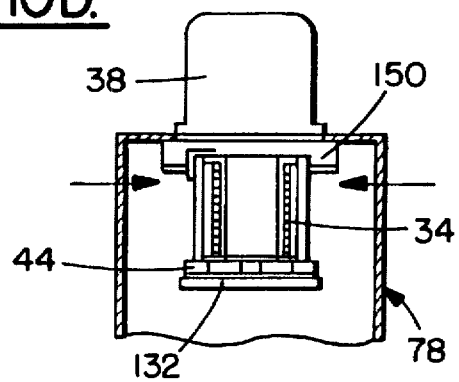
Figure 10E:
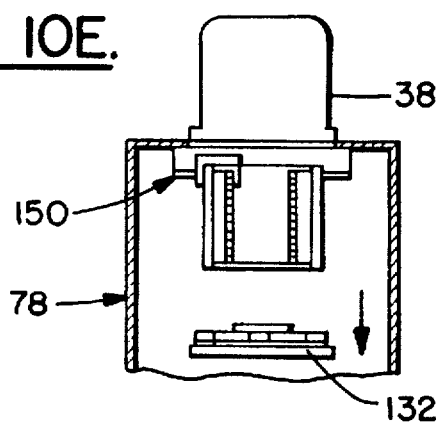

Then, with the cassette being suspended by the gripper mechanism 144 as seen in FIG. 10D, the first and second actuators 124, 128 are operable together to move the shelf 132 with the port door, the carrier door and the cassette thereon to the withdrawn position illustrated in FIG. 10E, typically at a height of 132 mm above the level of the floor 132.

It was previously mentioned that the system 20 includes a second transport mechanism 70 which serves to retrieve the cassette 34 from the interior region 54 of the mini-environment 52 and move it into the load lock chamber 46.

Figure 10F:
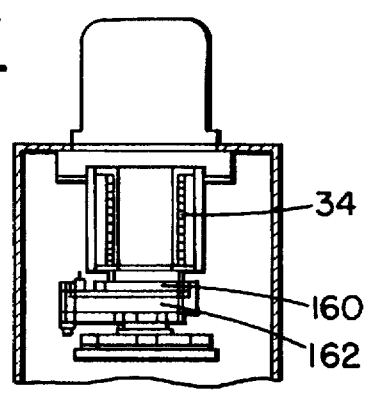
Figure 10G:
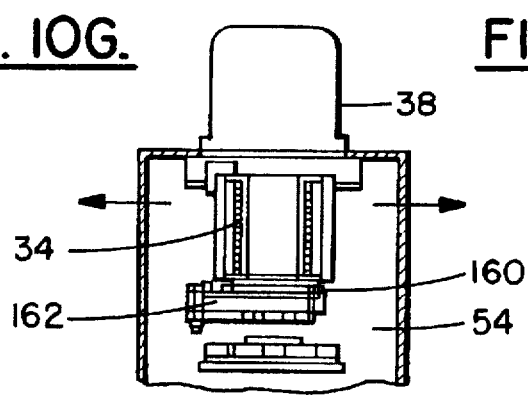
Figure 10H:
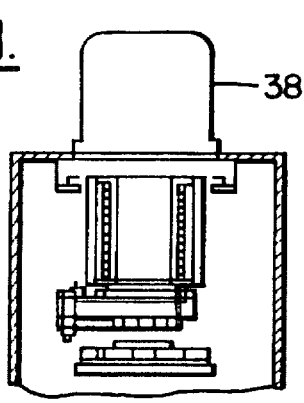

This mechanism will now be described in greater detail with particular reference to FIGS. 1 and 2. A more complete description of the second transport mechanism 70 may be found in the disclosure of commonly assigned U.S. application Ser. No. 08/498,834 filed on Jul. 6, 1995. The entire disclosure of that application is hereby incorporated into this disclosure by reference. The second transport mechanism 70 includes a platform 160 for the selective reception thereon of the cassette within the interior region. A drive arm linkage 162 on the load lock 22 is operable for moving the platform 160 between an extended position within the interior region 54 of the mini-environment aligned with the port opening 58 in the port plate 56 (see FIGS. 10F, 10G, 10H) and a retracted position within the load lock chamber (FIG. 2).

Figure 2A:
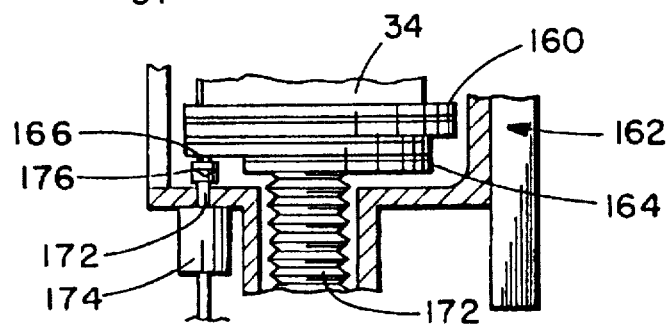
FIG. 2A is a detail cross section view of certain parts illustrated in FIG. 1 and depicting another relative position thereof.

A base member 164 (FIGS. 2 and 2A) is suitably mounted inside the load lock chamber 46. The drive arm linkage 162 is pivotally mounted on the base member 164 for moving the platform 160 in plane between the extended and retracted positions mentioned above. A drive arm shaft 166 is rotatably mounted on the base member 164, the drive arm linkage 162 being fixed to the drive arm shaft for movement of the platform 160 between the retracted position and the extended position.

An elevator drive mechanism 168 is operable for selectively moving the base member 164 between a raised position and a lowered position. To this end, it may include a drive motor 170 and a screw 172 suitably mounted on the base member. When the platform 160 is in the interior region 54 aligned with the port opening 58 in the port plate 56 (see FIG. 10F), the elevator drive mechanism 168 may be operated to move the platform vertically into supporting engagement of the cassette. Thereupon, the gripper mechanism 144 is moved (FIG. 10G) to a disengaged position (FIG. 10H) upon engagement of said cassette on said platform.

The second transport mechanism 70 further includes a drive shaft 173 and a motor 174 for rotating the drive shaft. A suitable coupling device 176 serves to drivingly connect the drive arm shaft 166 to the drive shaft 173 when the base member 164 is in the lowered position.

The system 20 is provided with a number of sensors to continually provide the operator with appropriate information regarding the status of the operation.

Figure 14:
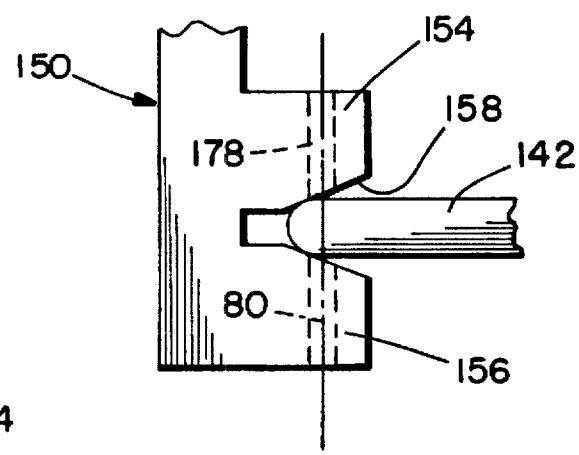

In one instance, as seen in FIG. 14, the gripper mechanism includes a suitable sensor for detecting whether or not the flanges 142 of the cassette 34 are properly engaged by the receiving notch 158 between the opposed fingers 154, 156. In this instance, a transmitter 178 on the first finger 154 is operable for directing a signal toward the second finger 156. The second finger 156 has a receiver 180 thereon positioned to receive the signal from the transmitter on the first finger. With this construction, the presence of a signal at the receiver 180 indicates the absence of the cassette being properly positioned between the fingers and the absence of a signal at the receiver indicates the presence of the cassette flange 142 between the fingers.

In another instance, it is desirable to know whether, in fact, a cassette is actually present in the carrier 32. For this purpose, viewing FIG. 10A, a cassette-present transmitter 182 is provided on one of the hood walls 80 for directing a signal toward a cassette-present receiver 184 on an opposite one of the hood walls across the path of the cassette as the hood is moved between the lowered (FIG. 10B) and raised (FIG. 10C) positions. With this arrangement, the presence of a signal at the receiver 184 indicates the absence of the cassette within the interior region 54 and the absence of a signal at the receiver indicates the presence of the cassette within the interior region.

In still another instance, it is desirable to know whether any wafers are, undesirably, partially in and partially out of the cassette 34. For this purpose, viewing FIG. 10A, a wafer slide-out transmitter 186 is provided on one of the hood walls 80 for directing a signal toward a wafer slide-out receiver 188 on an opposite one of the hood walls across the path of the cassette, again as the hood is moved between the lowered (FIG. 10B) and raised (FIG. 10C) positions. With this arrangement, the presence of a signal at the receiver 188 indicates the proper positioning of wafers within the cassette and the absence of a signal at the receiver indicates that a wafer improperly projects outside of the cassette.

Another feature of the present invention, as best seen in FIGS. 5 and 6, resides in the fact that the system 20 includes an airflow generating subsystem 190 for directing laminar flow air through the interior region 54 of the mini-environment 52 for the purpose of removing foreign particles from the interior region and, in particular, from the wafers 36 supported in the cassette 34. The subsystem 190 includes a suitable fan 192 mounted on the hood 78 for vertical movement therewith. The fan serves to create a positive pressure within the mini-environment to guard against entry of contaminants from the surrounding atmosphere. The fan also operates to produce a circulating air stream, indicated by arrows 193, within the mini-environment. By reason of the fact that the positive pressure within the mini-environment causes excess air, approximately 10% to 15%, to be exhausted through the capillary seal between the upstanding walls 75 and the hood walls 80, it is necessary to replenish it with "make-up" air from the surrounding atmosphere. For this purpose, a suitable adjustable air damper 200 is provided on the hood 78 for communication between the surrounding atmosphere and the fan 192, for drawing in a sufficient quantity of make-up air and introducing it to the fan as to offset the quantity of air which escapes from the mini-environment through the capillary seal between the hood and the main housing.

Another critical component of the subsystem 190 is a filter 194, preferably an ULPA (Ultra Low Penetration Air) filter which is approximately 99.999% efficient for removal from an air stream of particle sizes in the general range of 0.1 to 0.2 microns. The filter 194 is suitably mounted on the hood 78 downstream of the fan 192 for removing particulate material from the air stream indicated by the arrows 193. A duct 196 is suitably provided in the mini-environment 52 and mounted on the hood 78 for containing and directing the flow of air from the fan to the filter.

As with the fan 192 and duct 196, the filter 194 is mounted on the hood for movement with the hood and has an exhaust face 202 through which the entire air stream passing through the filter exhausts into and through the cassette 34 when the cassette is fully inside the mini-environment as indicated in FIGS. 5 and 6. In this instance, an entire projected area of the exhaust face 202 of the filter 194 is substantially equal to an entire projected area of the cassette.

With the construction just described, it will be appreciated that with movement of the hood 78 between a lowered position as indicated in FIG. 6A and a raised position as indicated in FIGS. 5, 6, and 6D, each incremental (as indicated sequentially in FIGS. 6B and 6C) projected area of the exhaust face 202 positioned above a plane of the carrier door 44 is juxtaposed to an equally sized incremental projected area of the cassette positioned below a plane of the carrier port 40.

Downstream of the cassette, a suitably formed plenum 204 is provided for containing and directing the flow of air from the cassette for return to the fan. A distribution plate 206 (FIGS. 6, 6A–6E), which is a part of a wall of the plenum is provided with a plurality of uniformly spaced perforations 208 across its entire surface proximate to and coextensive with the cassette when the cassette assumes the position indicated in FIG. 6D. The purpose of the distribution plate 206 is to prevent a concentration of flow lines and, rather, to assure the uniformity of flow of the air stream within the mini-environment 52 and, most specifically, as it returns to the fan.

Another air stream control expedient is an adjustable flow damper 210 positioned at an interface between the plenum 204 and the fan 192. The damper 210 is primarily operated to assure that turbulent flow is avoided at all times.

The primary purpose of the airflow generating subsystem, then, is to assure that a cassette being removed from the clean environment of the portable carrier 32 will experience in the mini-environment 52 a similar level of cleanliness. All of the expedients just described operate to guard against turbulent or rolling flow which would undesirably introduce particulate matter to the cassette and to the semiconductor wafers supported thereon. In this regard, the goal sought, and achiever by the invention is essentially two-fold: first, do not stir up the air stream in the mini-environment 52 any more than absolutely necessary, else particles on adjacent surfaces may themselves become airborne; and second, keep particles already in the air stream moving until they can be intercepted and removed by the filter 194.

While preferred embodiments of the invention have been disclosed in detail, it should be understood by those skilled in the art that various other modifications may be made to the illustrated embodiments without departing from the scope of the invention as described in the specification and defined in the appended claims.

What is claimed is:

1. A system for batch handling semiconductor wafers comprising:

a portable carrier for transporting the wafers in a substantially particle free environment, said carrier including a cover having a carrier port for providing access to the interior thereof, a carrier door movable between a closed position sealingly engaged with the carrier port and an open position spaced therefrom and latching means normally biased toward a latching position sealingly attaching said carrier door to said carrier cover and being operable for movement toward an unlatching position releasing said carrier door from said carrier cover;

a cassette freely received within said carrier for supporting a plurality of the wafers in spaced generally stacked relationship, said cassette being releasably supported on said carrier door;

a load lock defining a chamber therein with a substantially particle free environment from which individual wafers may be selectively withdrawn for placement into one or more processing stations, said load lock having a load lock port opening into the load lock chamber and including a load lock door movable between a closed position overlying said load lock port for sealing the load lock chamber from the surrounding atmosphere and an open position spaced therefrom;

a mini-environment defining an interior region adjacent said load lock for engageable reception thereon of said carrier, said mini-environment sealingly isolating the load lock chamber and the interior of said carrier from the surrounding atmosphere, said mini-environment including a main housing adjacent said load lock, said main housing including a base and upstanding walls encompassing an interior region and having an uppermost rim defining an opening into the interior region, a hood overlying said rim and said upstanding walls including a generally level port plate and integral hood walls depending from said port plate, said hood walls lying in planes substantially parallel to said upstanding walls and being in sufficient proximity to said upstanding walls to thereby form a capillary seal therebetween, said hood being movable between lowered and raised positions while maintaining the capillary seal between said hood walls and said upstanding walls, said port plate having a port opening therein to enable communication between the interior region and the surrounding atmosphere, and wherein said port plate and said carrier include mutually engageable locating means for positioning said carrier thereon such that said carrier door is proximate to and substantially coextensive with said port door; and transfer means for retrieving said cassette from said carrier and for moving said carrier into the load lock chamber while maintaining it in a particle free environment, said transfer means including:

first transport means for retrieving said cassette from said carrier and moving it into the interior region of said mini-environment and including a port door movable between a closed position generally coplanar and sealingly engaged with the port opening and an open position disengaged and distant from the port opening, said port door including motive means for selectively operating said latching means of said carrier against the bias thereon to move said latching means toward the unlatched position;

a shelf for gravitational reception thereon of said port door with said cassette supported thereon; and actuating means for raising said shelf proximate said port door, then for lowering said shelf, said port door and said cassette into the interior region; and second transport means for retrieving said cassette from the interior region of said mini-environment and for moving it into said load lock chamber.

2. A system as set forth in claim 1 including:

a load lock door drive mechanism for moving said load lock door between the closed and open positions.

3. A system as set forth in claim 1 wherein said first transport means includes:

a first actuator mounted on said base for driving a first actuator rod; and a second actuator for driving a second actuator rod;

said second actuator being fixed to said first actuator rod away from said first actuator;

said shelf being fixed to said second actuator rod away from said second actuator;

said first actuator and said second actuator being operable together to move said shelf from a withdrawn position distant from said port door to an advanced position proximate said port door.

4. A system as set forth in claim 3 wherein said port door includes unlocking means engageable with said latching means when said shelf is in said advanced position proximate said port door and operable to move said latching means to said unlatching position; and wherein, with said shelf being in the advanced position proximate said port door, said second actuator is selectively operable to move said shelf with said port door and said cassette thereon to an intermediate position between said withdrawn position and said advanced position;

wherein said hood includes:
  lifting means for moving said hood between said lowered and raised positions; and
  gripper means movable between a position disengaged from said cassette and an engaged position for holding said cassette suspended within the interior region, said gripper means being movable to said engaged position when said shelf is moved to said intermediate position;

wherein, with said cassette being suspended by said gripper means, said first and second actuators are operable together to move said shelf with said port door thereon to said withdrawn position;

wherein said second transport means includes:
  a platform for the selective reception thereon of said cassette within the interior region;
  drive arm means on said load lock for moving said platform between an extended position within the interior region of said mini-environment aligned with the port opening in said port plate and a retracted position within the load lock chamber; and
  elevator drive means for moving said platform vertically into engagement with said cassette to receive said cassette thereon;

said gripper means being moved to a disengaged position upon engagement of said cassette on said platform.

5. A system as set forth in claim 4
wherein said second transport means includes:
  a base member mounted inside the load lock chamber, said drive arm means being pivotally mounted on said base member for moving said platform in a plane between the extended and retracted positions;
  a drive arm shaft rotatably mounted on said base member, said drive arm means being fixed to said drive arm shaft for movement of said platform between the retracted position and the extended position; and
  wherein said elevator drive means is operable for selectively moving said base member between a raised position and a lowered position;
  a drive shaft;
  motor means for rotating said drive shaft; and
  coupling means for drivingly connecting said drive arm shaft to said drive shaft when said base member is in the lowered position.

6. A system as set forth in claim 4
wherein said gripper means are mounted on said port plate within the interior region.

7. A system as set forth in claim 4
wherein said cassette includes opposed flanges integral therewith; and
wherein said gripper means include:
  gripper fingers releasably engageable with said opposed flanges; and
  gripper drive means for moving said gripper fingers between said engaged and said disengaged positions.

8. A system as set forth in claim 7
wherein said gripper fingers include:
  first and second opposed fingers;
  a transmitter on said first finger for directing a signal toward said second finger, said second finger having a receiver thereon positioned to receive the signal from said transmitter on said first finger;
  whereby the presence of a signal at said receiver indicates the absence of said cassette properly positioned between said fingers; and
  whereby the absence of a signal at said receiver indicates the presence of said cassette flange between said fingers.

9. A system as set forth in claim 4
wherein said gripper means include sensor means for detecting whether or not said cassette is properly engaged.

10. A system as set forth in claim 1
wherein said second transport means includes:
  a platform for the selective reception thereon of said cassette within the interior region; and
  drive arm means on said load lock for moving said platform between an extended position within the interior region of said mini-environment aligned with the port opening in said port plate and a retracted position within the load lock chamber.

11. A system as set forth in claim 1
wherein said carrier door includes resilient means biasing said latching means toward the latching position.

12. A system as set forth in claim 1
wherein said second transport means includes:
  a platform for the selective reception thereon of said cassette; and
  drive arm means on said load lock for moving said platform between an extended position within said mini-environment and a retracted position within the load lock chamber.

13. A system as set forth in claim 12 including:
a base member mounted inside the load lock chamber, said drive arm means being mounted on said base member for moving said platform in a plane between the extended and retracted positions.

14. A system as set forth in claim 13
wherein said drive arm means includes:
  a drive arm pivotally mounted on said base member and movable between the retracted position and the extended position;
  a drive arm shaft rotatably mounted on said base member, said drive arm being fixed to said drive arm shaft for movement of said platform between the retracted position and the extended position.

15. A system as set forth in claim 14 including:
elevator drive means operable for selectively moving said base member between a raised position and a lowered position;
a drive shaft;
motor means for rotating said drive shaft; and
coupling means for drivingly connecting said drive arm shaft to said drive shaft when said base member is in the lowered position.

16. A system as set forth in claim 1
wherein said second transport means includes:
  a platform for the selective reception thereon of said cassette; and
  drive arm means on said load lock for moving said platform between an extended position within the interior region of said mini-environment aligned with the port opening in said port plate and a retracted position within the load lock chamber.

17. A system as set forth in claim 16 including:

airflow generating means for directing a laminar flow air stream through the interior region of said mini-environment and for removing foreign particles from wafers supported in said cassette.

18. A system as set forth in claim 17 wherein said air flow generating means includes:

a fan for creating positive pressure and for producing a circulating air stream within said mini-environment;

a filter downstream of said fan for removing particulate material from the air;

duct means for containing and directing the air stream from said fan to said filter; and plenum means for containing and directing the flow of air from said cassette for return to said fan.

19. A system as set forth in claim 17 wherein said air flow generating means includes:

a fan for creating positive pressure and for producing a circulating air stream within said mini-environment;

air damper means on said hood in fluid communication with said fan enabling said fan to draw air from the surrounding atmosphere into said mini-environment to offset the quantity of air which escapes from said mini-environment through the capillary seal between said hood and said main housing;

a filter downstream of said fan for removing particulate material from the air;

duct means for containing and directing the air stream from said fan to said filter; and plenum means for containing and directing the flow of air from said cassette for return to said fan.

20. A system as set forth in claim 19 including: adjustable flow damping means intermediate said plenum means and said fan for maintaining laminar flow in the air stream produced within said mini-environment.

21. A system as set forth in claim 19 including:

wherein said filter is mounted on said hood for movement therewith and has an exhaust face through which the entire air stream passing through said filter exhausts into and through said cassette, an entire projected area of said exhaust face of said filter being substantially equal to the entire projected area of said cassette; and wherein, with movement of said hood between said lowered position and said raised position, each incremental projected area of said exhaust face positioned above a plane of said carrier door is juxtaposed to an equally sized incremental projected area of said cassette positioned below a plane of the carrier port.

22. A system as set forth in claim 21 wherein said plenum means includes, as a part of a wall thereof, a distribution plate proximate to and coextensive with said cassette when said hood is in the raised position, said distribution plate having a plurality of uniformly spaced perforations across its entire surface.

23. A system as set forth in claim 19 including:

flow damper means for controlling the flow of air between said plenum means and said fan.

24. A system as set forth in claim 1 including:

cassette present sensor means including:

a transmitter on one of said hood walls for directing a signal toward a receiver on an opposite one of said hood walls across the path of said cassette as said hood is moved between said lowered and raised positions;

whereby the presence of a signal at said receiver indicates the absence of said cassette within the interior region and the absence of a signal at said receiver indicates the presence of said cassette within the interior region.

25. A system as set forth in claim 1 including:

wafer slide-out sensor means including:

a transmitter on one of said hood walls for directing a signal toward a receiver on an opposite one of said hood walls across the path of said cassette as said hood is moved between said lowered and raised positions;

whereby the presence of a signal at said receiver indicates the proper positioning of a wafer within said cassette and the absence of a signal at said receiver indicates that a wafer improperly projects outside of said cassette.

26. A system for batch handling semiconductor wafers supported in spaced generally stacked relationship in a cassette freely received within a portable carrier in a substantially particle free environment, said system comprising:

a load lock defining a chamber therein with a substantially particle free environment from which individual wafers may be selectively withdrawn for placement into one or more processing stations, said load lock having a load lock port opening into the load lock chamber and including a load lock door movable between a closed position overlying said load lock port for sealing the load lock chamber from the surrounding atmosphere and an open position spaced therefrom;

a load lock door drive mechanism for moving said load lock door between the closed and open positions;

a mini-environment defining an interior region adjacent said load lock and including a port plate having a port therein for communication between the interior region and the outside environment and including a port door movable between a closed position sealingly overlying the port and an open position distant from the port, said port plate adapted for engageable reception thereon of the carrier, said mini-environment sealingly isolating the load lock chamber and the interior of the carrier from the surrounding atmosphere; and transfer means for retrieving the cassette from the carrier and for moving the cassette into said load lock chamber while maintaining it in a particle free environment, said transfer means including:

first transport means for retrieving said cassette from said carrier and moving it into the interior region of said mini-environment; and second transport means for retrieving said cassette from the interior region of said mini-environment and for moving it into said load lock chamber;

said second transport means including:

a platform for the selective reception thereon of said cassette; and drive arm means on said load lock for moving said platform between an extended position within the interior region of said mini-environment aligned with the port opening in said port plate and a retracted position within the load lock chamber.

27. A system as set forth in claim 26 including:

airflow generating means for directing laminar flow air through the interior region of said mini-environment and for removing foreign particles from wafers supported in said cassette.

28. A system as set forth in claim 26 including:

a portable carrier for transporting the cassette and the wafers supported therein in a substantially particle free environment between a distant location and said mini-environment, said carrier including a cover having a carrier port for providing access to the interior thereof and a carrier door movable between a closed position sealingly engaged with said carrier and overlying the carrier port and an open position spaced from said carrier;

said carrier being selectively receivable on said port plate such that the carrier port is proximate to and coextensive with the mini-environment port, said carrier door being contiguous with said port door; and coupling means for selectively coupling said carrier door to said port door.

29. A system as set forth in claim 28 wherein said cassette is releasably supported on said carrier door;

wherein said carrier includes:
latching means normally biased toward a latching position sealingly attaching said carrier door to said carrier cover and being operable for movement toward an unlatching position releasing said carrier door from said carrier cover; and wherein said mini-environment includes:
a main housing adjacent said load lock, said main housing including a base and upstanding walls encompassing an interior region and having an uppermost rim defining an opening into the interior region; and a hood overlying said rim and said upstanding walls including a generally level port plate and integral hood walls depending from said port plate, said hood walls lying in planes substantially parallel to said upstanding walls and being in sufficient proximity to said upstanding walls to thereby form a capillary seal therebetween, said hood being movable between lowered and raised positions while maintaining the capillary seal between said hood walls and said upstanding walls, said port plate having a port opening therein to enable communication between the interior region and the surrounding atmosphere; and wherein said port plate and said carrier include mutually engageable locating means for positioning said carrier thereon such that said carrier door is proximate to and substantially coextensive with said port door;

wherein said first transport means includes:
a port door movable between a closed position generally coplanar and sealingly engaged with the port opening and an open position disengaged and distant from the port opening, said port door including motive means for selectively operating said latching means of said carrier against the bias thereon to move said latching means toward the unlatched position; and a shelf for gravitational reception thereon of said port door with said cassette supported thereon; and actuating means for raising said shelf proximate said port door, then for lowering said shelf, said port door and said cassette into the interior region.

30. A system as set forth in claim 29 wherein said first transport means includes:
a first actuator mounted on said base for driving a first actuator rod; and a second actuator for driving a second actuator rod;

said second actuator being fixed to said first actuator rod away from said first actuator;

said shelf being fixed to said second actuator rod away from said second actuator;

said first actuator and said second actuator being operable together to move said shelf from a withdrawn position distant from said port door to an advanced position proximate said port door.

31. A system as set forth in claim 30 wherein said port door includes unlocking means engageable with said latching means when said shelf is in said advanced position proximate said port door and operable to move said latching means to said unlatching position; and wherein, with said shelf being in the advanced position proximate said port door, said second actuator is selectively operable to move said shelf with said port door and said cassette thereon to an intermediate position between said withdrawn position and said advanced position;

wherein said hood includes:
lifting means for moving said hood between said lowered and raised positions; and gripper means movable between a position disengaged from said cassette and an engaged position for holding said cassette suspended within the interior region, said gripper means being movable to said engaged position when said shelf is moved to said intermediate position;

wherein, with said cassette being suspended by said gripper means, said first and second actuators are operable together to move said shelf with said port door thereon to said withdrawn position;

wherein said second transport means includes:
elevator drive means for moving said platform vertically into engagement with said cassette to receive said cassette thereon;

said gripper means being moved to a disengaged position upon engagement of said cassette on said platform.

32. A system as set forth in claim 31 wherein said second transport means includes:
a base member mounted inside the load lock chamber, said drive arm means being pivotally mounted on said base member for moving said platform in a plane between the extended and retracted positions;

a drive arm shaft rotatably mounted on said base member, said drive arm means being fixed to said drive arm shaft for movement of said platform between the retracted position and the extended position; and wherein said elevator drive means is operable for selectively moving said base member between a raised position and a lowered position;

a drive shaft;

motor means for rotating said drive shaft; and coupling means for drivingly connecting said drive arm shaft to said drive shaft when said base member is in the lowered position.

33. A system as set forth in claim 31 wherein said gripper means are mounted on said port plate within the interior region.

34. A system as set forth in claim 31 wherein said cassette includes opposed flanges integral therewith; and wherein said gripper means include:
gripper fingers releasably engageable with said opposed flanges; and gripper drive means for moving said gripper fingers between said engaged and said disengaged positions.

35. A system as set forth in claim 34 wherein said gripper fingers include:
- first and second opposed fingers;
- a transmitter on said first finger for directing a signal toward said second finger, said second finger having a receiver thereon positioned to receive the signal from said transmitter on said first finger;
- whereby the presence of a signal at said receiver indicates the absence of said cassette properly positioned between said fingers; and
- whereby the absence of a signal at said receiver indicates the presence of said cassette flange between said fingers.

36. A system as set forth in claim 31 wherein said gripper means include sensor means for detecting whether or not said cassette is properly engaged.

37. A system as set forth in claim 29 wherein said carrier door includes resilient means biasing said latching means toward the latching position.

38. A system as set forth in claim 29 including:
a base member mounted inside the load lock chamber, said drive arm means being mounted on said base member for moving said platform in a plane between the extended and retracted positions.

39. A system as set forth in claim 38 wherein said drive arm means includes:
- a drive arm pivotally mounted on said base member and movable between the retracted position and the extended position;
- a drive arm shaft rotatably mounted on said base member, said drive arm being fixed to said drive arm shaft for movement of said platform between the retracted position and the extended position.

40. A system as set forth in claim 39 including:
elevator drive means operable for selectively moving said base member between a raised position and a lowered position;
a drive shaft;
motor means for rotating said drive shaft; and
coupling means for drivingly connecting said drive arm shaft to said drive shaft when said base member is in the lowered position.

41. A system as set forth in claim 29 including:
cassette present sensor means including:
- a transmitter on one of said hood walls for directing a signal toward a receiver on an opposite one of said hood walls across the path of said cassette as said hood is moved between said lowered and raised positions;
- whereby the presence of a signal at said receiver indicates the absence of said cassette within the interior region and the absence of a signal at said receiver indicates the presence of said cassette within the interior region.

42. A system as set forth in claim 29 including:
wafer slide-out sensor means including:
- a transmitter on one of said hood walls for directing a signal toward a receiver on an opposite one of said hood walls across the path of said cassette as said hood is moved between said lowered and raised positions;
- whereby the presence of a signal at said receiver indicates the proper positioning of a wafer within said cassette and the absence of a signal at said receiver indicates that a wafer improperly projects outside of said cassette.

43. A system as set forth in claim 28 including:
airflow generating means for directing a laminar flow air stream through the interior region of said mini-environment and for removing foreign particles from wafers supported in said cassette.

44. A system as set forth in claim 43 wherein said air flow generating means includes:
- a fan for creating positive pressure and for producing a circulating air stream within said mini-environment;
- a filter downstream of said fan for removing particulate material from the air;
- duct means for containing and directing the air stream from said fan to said filter; and
- plenum means for containing and directing the flow of air from said cassette for return to said fan.

45. A system as set forth in claim 44 including:
adjustable flow damping means intermediate said plenum means and said fan for maintaining laminar flow in the air stream produced within said mini-environment.

46. A system as set forth in claim 45 wherein said filter is mounted on said hood for movement therewith and has an exhaust face through which the entire air stream passing through said filter exhausts into and through said cassette, an entire projected area of said exhaust face of said filter being substantially equal to the entire projected area of said cassette; and
wherein, with movement of said hood between said lowered position and said raised position, each incremental projected area of said exhaust face positioned above a plane of said carrier door is juxtaposed to an equally sized incremental projected area of said cassette positioned below a plane of the carrier port.

47. A system as set forth in claim 46 wherein said plenum means includes, as a part of a wall thereof, a distribution plate proximate to and coextensive with said cassette when said hood is in the raised position, said distribution plate having a plurality of uniformly spaced perforations across its entire surface.

48. A system as set forth in claim 44 including:
flow damper means for controlling the flow of air between said plenum means and said fan.

49. A system as set forth in claim 28 including:
adjustable flow damping means intermediate said plenum means and said fan for maintaining laminar flow in the air stream produced within said mini-environment.

50. A method of batch handling semiconductor wafers comprising the steps of:
(a) transporting the wafers from a distant location in a portable carrier having a substantially particle free environment to a mini-environment defining an interior region with a substantially particle free environment;
(b) supporting a plurality of the wafers in spaced generally stacked relationship within a cassette freely received within the carrier;
(c) providing the mini-environment with a port plate with a port opening therein to enable communication between the interior region and the surrounding atmosphere and with a port door movable between a closed position generally coplanar and sealingly engaged with the port opening and an open position disengaged and distant from the port opening;
(d) providing the mini-environment with a main housing proximate to a load lock defining a chamber therein with a substantially particle free environment from which individual wafers may be selectively withdrawn for placement into one or more processing stations, the load lock having a load lock port opening into the load lock chamber and including a load lock door movable between a closed position overlying said load lock port for sealing the load lock chamber from the surrounding atmosphere and an open position spaced therefrom, the main housing including a base and upstanding walls encompassing the interior region and having an uppermost rim defining an opening into the interior region and a hood overlying the rim and the upstanding walls including a generally level port plate and integral hood walls depending from the port plate, the hood walls lying in planes substantially parallel to the upstanding walls and being in sufficient proximity to the upstanding walls to thereby form a capillary seal therebetween;

(e) providing the carrier with a cover having a carrier port for providing access to the interior thereof and a carrier door movable between a closed position sealingly engaged with the carrier port and an open position spaced therefrom;

(f) placing the carrier upon the mini-environment such that the carrier port is coextensive with the port opening of the mini-environment;

(g) providing the port plate and the carrier with mutually engageable locating means for positioning the carrier thereon such that the carrier door is proximate to and substantially coextensive with the port door;

(h) simultaneously unlatching the carrier door from the carrier and the port door from the hood, respectively; and (i) moving the hood and the carrier cover on the port plate between lowered and raised positions while maintaining the capillary seal between the hood walls and the upstanding walls, thereby introducing the cassette into the interior region of the mini-environment;

(j) retrieving the cassette from the interior region of the mini-environment and moving it into the load lock chamber;

(k) retrieving wafers from the carrier and moving them into the interior region of the mini-environment; and (l) retrieving wafers from the interior region of the mini-environment and moving them into the load lock chamber.

51. A method of batch handling semiconductor wafers as set forth in claim 50
wherein, upon completion of processing of individual wafers in the processing stations, performing steps (l), (k), and (a) in reverse order.

52. A method of batch handling semiconductor wafers as set forth in claim 50
wherein step (k) includes the step of:
(m) simultaneously moving the carrier door and the port door from their closed positions to their open positions, respectively; and
wherein step (l) includes the step of:
(n) moving the load lock door to the open position.

53. A method of batch handling semiconductor wafers as set forth in claim 50
wherein step (i) includes the step of:
(m) sensing for the properly positioned presence of the cassette in the interior region of the mini-environment.

54. A method of batch handling semiconductor wafers as set forth in claim 50
wherein step (k) includes the step of:
(m) sensing for the presence of the cassette in the carrier.

55. A method of batch handling semiconductor wafers as set forth in claim 50
wherein step (i) includes the step of:
(m) sensing that all wafers in the cassette are properly positioned therein.

56. A method of batch handling semiconductor wafers as set forth in claim 50 including the steps of:
(m) directing a laminar flow air stream through the interior region of the mini-environment; and
(n) removing foreign particles from wafers supported in the cassette.

57. A method of batch handling semiconductor wafers as set forth in claim 56
wherein step (m) includes the step of:
(o) providing a fan for creating positive pressure and for producing a circulating air stream within the mini-environment; and
wherein step (n) includes the step of:
(p) providing a filter downstream of the fan for removing particulate material from the air, the filter having an exhaust face with a projected area.

58. A method of batch handling semiconductor wafers as set forth in claim 57 including the step of:
(q) directing the entire air stream passing through the filter so as to exhaust into and through the cassette, the entire projected area of the exhaust face of the filter being substantially equal to the entire projected area of the cassette.

59. A method of batch handling semiconductor wafers as set forth in claim 50 including the steps of:
(m) directing a laminar flow air stream through the interior region of the mini-environment;
(n) removing foreign particles from wafers supported in the cassette; and
(o) introducing air from the surrounding atmosphere into the mini-environment to offset the quantity of air which escapes from the mini-environment through the capillary seal between the hood and the main housing.

60. A method of batch handling semiconductor wafers as set forth in claim 50 including the step of:
(m) moving the hood between the lowered position and the raised position such that each incremental projected area of the exhaust face positioned above a plane of the carrier door is juxtaposed to an equally sized incremental projected area of the cassette positioned below a plane of the carrier port.

61. A system for batch handling semiconductor wafers comprising:
a portable carrier for transporting the wafers in a substantially particle free environment, said carrier including a cover having a carrier port for providing access to the interior thereof and a carrier door movable between a closed position sealingly engaged with the carrier port and an open position spaced therefrom;
a cassette freely received within said carrier for supporting a plurality of the wafers in spaced generally stacked relationship;
a load lock defining a chamber therein with a substantially particle free environment from which individual wafers may be selectively withdrawn for placement into one or more processing stations, said load lock having a load lock port opening into the load lock chamber and including a load lock door movable between a closed position overlying said load lock port for sealing the load lock chamber from the surrounding atmosphere and an open position spaced therefrom;

a mini-environment defining an interior region adjacent said load lock for engageable reception thereon of said carrier, said mini-environment sealingly isolating the load lock chamber and the interior of said carrier from the surrounding atmosphere; and transfer means for retrieving said cassette from said carrier and for moving said cassette into the load lock chamber while maintaining it in a particle free environment, said transfer means including:

first transport means for retrieving said cassette from said carrier and moving it into the interior region of said mini-environment; and second transport means for retrieving said cassette from the interior region of said mini-environment and for moving it into said load lock chamber, said second transport means including:

a platform for the selective reception thereon of said cassette; and drive arm means on said load lock for moving said platform between an extended position within the interior region of said mini-environment aligned with the port opening in said port plate and a retracted position within the load lock chamber.

62. A system as set forth in claim 61 including:

airflow generating means for directing a laminar flow air stream through the interior region of said mini-environment and for removing foreign particles from wafers supported in said cassette.

63. A system as set forth in claim 62 wherein said air flow generating means includes:

a fan for creating positive pressure and for producing a circulating air stream within said mini-environment;

a filter downstream of said fan for removing particulate material from the air;

duct means for containing and directing the air stream from said fan to said filter; and plenum means for containing and directing the flow of air from said cassette for return to said fan.

64. A system as set forth in claim 63 including:

adjustable flow damping means intermediate said plenum means and said fan for maintaining laminar flow in the air stream produced within said mini-environment.

* * * * *